United States Patent [19]

Raggenbass et al.

[11] 4,225,961
[45] Sep. 30, 1980

[54] SYSTEM FOR MONITORING THE VALIDITY OF ELECTRICAL DATA FED TO A NUMBER OF N FUNCTIONALLY PARALLEL-CONNECTED DATA CHANNELS

[75] Inventors: Werner Raggenbass, Schwerzenbach; Kurt Zwar, Brugg, both of Switzerland

[73] Assignee: BBC Brown, Boveri & Company, Limited, Baden, Switzerland

[21] Appl. No.: 930,610

[22] Filed: Aug. 3, 1978

[30] Foreign Application Priority Data

Aug. 9, 1977 [CH] Switzerland .................. 9686/77

[51] Int. Cl.² .................. G06F 11/00; H03K 13/32
[52] U.S. Cl. .................. 371/36; 371/68
[58] Field of Search .................. 340/146.1, 146.1 AB, 340/146.1 R; 235/303, 307

[56] References Cited

U.S. PATENT DOCUMENTS

| | | | |
|---|---|---|---|
| 3,541,507 | 11/1970 | Duke | 340/146.1 AB |
| 3,559,168 | 1/1971 | Carter et al. | 340/146.1 AB |
| 3,638,184 | 1/1972 | Beuscher et al. | 340/146.1 AB |
| 3,688,261 | 8/1972 | Henderson | 340/146.1 AB |
| 3,722,107 | 3/1973 | Muller | 340/146.1 AB |

*Primary Examiner*—Charles E. Atkinson
*Attorney, Agent, or Firm*—Orville N. Greene; Frank L. Durr

[57] ABSTRACT

A system for monitoring the data processed by functionally parallel-connected channels as to their validity. Conclusions on correct or incorrect processing are determined by checking whether the data on the parallel channels exhibit a predetermined mutual relationship.

51 Claims, 17 Drawing Figures

SYSTEM FOR MONITORING THE VALIDITY OF ELECTRICAL DATA FED TO A NUMBER OF N FUNCTIONALLY PARALLEL-CONNECTED DATA CHANNELS

BACKGROUND AND BRIEF SUMMARY OF THE INVENTION

This invention relates to a system for monitoring the validity of electrical data applied to n functionally parallel-connected data channels according to a fixed criterion, all of these data originating from one and the same data source. In accordance with this system, the data channels no longer allow conclusions to be drawn as to the correctness of the data issued by the data source if the data, at least for a predetermined period of time, on more than m of n channels disagree. The invention also concerns the employment of such a system.

In safety practice it is known to forward the data acquisitioned at a system to be monitored on several functionally parallel-connected processing channels which latter may sometimes comprise data acquisition and/or monitoring, data processing and data transmission systems. Such inherently costly functionally parallel-connected channels are used above all in cases where the data to be dealt with comprise information on non-hazardous conditions or on conditions which, in a system generating the primary data, are hazardous to human beings.

In this context it is predetermined how the data arriving on the parallel channels at the channel end must exhibit a mutual relationship, so that it becomes possible to draw conclusions on correct or incorrect processing. For example, if a number n parallel-connected channels are provided, it may be preselected that identical data must appear on at least q channels, if conclusions as to the validity of the primary data—whatever they are—are justifiable. This may better be understood by way of a specific example. If five parallel-connected channels are provided and q is chosen to be three, then, basically, the following data configurations may appear on the five channels:

(1) Data identical on all five channels. In this case, processing is correct.

(2) Data on four channels identical and on one channel different. In this case processing is correct according to the four identical channels.

(3) Data on three channels identical and on two channels different. In this case processing is correct according to the three identical channels.

From the foregoing it becomes evident that such a system does not operate unequivocally without further safeguards. The reason for this is clear. With identical data on three or even on four of the five parallel channels, the data are interpreted as being in accordance with the primary data (i.e., the data on the three or four channels). It is quite possible, however, that the data on these three or four channels are wrong and that the data on the two, or the one, remaining channel are correct. This consideration leads to the qualification that, in such systems, q-times-faults must be excluded, and this means that q of n processing channels must not become faulty at the same time.

It is of course possible to prove by probability calculation that the appearance of such q-times-faults is so unlikely that elimination without real impairment of the safety of such installations is justifiable. This is especially true since, owing to increasing the speed of the system, the separate detection of faults in terms of time becomes possible even with narrow time spacing.

Under this aspect, the present invention aims at providing a system which, in a faultproof manner and on the basis of predetermined criteria, checks the data processed by the functionally parallel-connected channels as to their validity in relation to the primary data and, in accordance with the result, releases the processed data for further processing, e.g. feed-back to the primary-data generating system. Following fault detection, the data are treated as non-significant, until the fault is eliminated. In the case of feed-back to the monitored system which generates primary data, the latter is then made to change into a safe condition if necessary. To this end, the present invention is characterized in that the n channels are connected to a first q of n selective logic system, q being equal to n−m, the logic system being devised so as to issue data which correspond to data, simultaneously present, on at least q of n channels and that the output of the selective logic system is in each case taken to one of the channels of n channel-related comparison elements whose outputs are each connected to a respective marking unit, in order to register the deviation of data on the channels in comparison with the output of data of the first selective logic system in relation to particular channels. In accordance with the invention, all the marking units are connected to a second q of n selective logic system which is devised so as to produce a first signal if the marking units have registered the data on at least q channels as non-deviating data, and to produce a second signal if the marking units have not registered the data on at least q channels as non-deviating data. The output of the first selective logic system is connected to a modulating input of an oscillator whose output is modulated with the channel data and connected to the comparison elements, the marking units and the second selective logic system. These components cooperate in such a way that the first output signal of the second selective logic system appears as a signal corresponding to the modulated oscillator signal and the second output signal is a direct current signal. The oscillator output signal is applied to the above-mentioned units as the data carrier signal and, also as a test frequency signal. The comparison elements, marking units and the second selective logic system are designed in such a way that the appearance of an internal fault causes an output signal to be produced which is identical to that produced when deviating channel data are registered.

BRIEF DESCRIPTION OF THE DRAWINGS

The invention will now be described by way of an example with reference to the drawings.

There is shown in.

DETAILED DESCRIPTION OF THE INVENTION

We begin by stating once more the selection criteria on which the whole description is based:

From x wrong variables (e.g., x channels with faulty data processing) and y correct variables, a "q of n" selective criterion produces a "correct" result if $$x \leq n - q = m$$

$$y > q = n - m$$

and a "wrong" result if $$x > n - q = m$$

$$y \leq q = n - m.$$

Therefore, if it is selected when defining q how many variables must be correct if an output variable is to be "correct", then it must be stated, when indicating m, how many variables may be wrong for a "correct" output to appear nevertheless.

Figure 1:
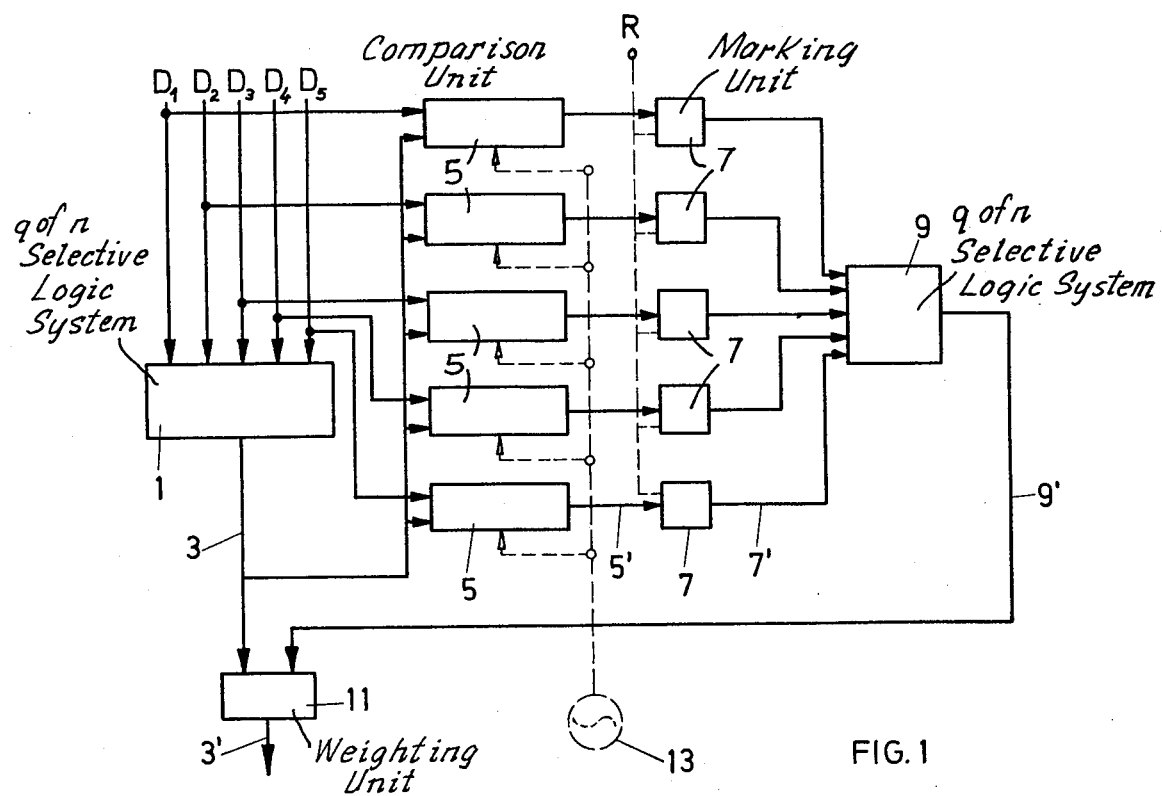
FIG. 1 a basic functional block diagram of a system according to the invention.

FIG. 1 shows, with reference to a functional-block diagram, and on the basis of the explanations in the introduction, how such a system is to be developed. If, for example, n is chosen as 5, the five data channels $D_1$ to $D_5$—in general terms, $D_1$ to $D_n$—are applied to a "q of n" selective logic system 1. In accordance with the predetermined value q, data will appear at output 3 of the selective logic system 1 which correspond to the same data of at least the number q of data channels D.

Usually, q is chosen as a majority of the number n which corresponds to the minimum majority $q_{min}$.

Eliminating q-times faults it is now determined that, given correct processing on all n channels, any difference between the incoming data on a channel in comparison with n-1 channels must be ascribed to a processing error in this very channel, the same applying to the second, third and eventually the (m+1) th channel. In the latter case, the entire processing section is interpreted as being faulty; that is, the incoming data do not allow conclusions to be drawn as to the validity of the primary data whatever the latter may be. It becomes apparent, then, that provisions must be made to ensure that the adulteration of the data on one of the processing channels should be recorded in relation to the specific channel. Since the data which appear at output 3 of the selective logic system 1 primarily correspond to the correct processing, the data arriving on channels $D_1$... $D_n$ may be compared, in comparison units 5, with the output data of the selective logic system 1. In accordance with the result of these n comparisons, channel-related marks for the channels recognized as faulty are set in n marking units 7. The output signals of the n marking units 7 are in turn fed to a q of n selective logic system 9 whose output signal indicates the number of processing channels recognized as faulty. Unlike the selective logic system 1, the selective logic system 9 produces an output signal of basically two conditions which are valid per se, i.e. a first condition signifying "at most n-q channels are defective and therefore at least q channels are still intact", and a second condition signifying "more than n-q channels are defective and therefore less than q channels are intact". The output signal of the selective logic system 1, on the other hand, corresponds to the information which is fed to $D_1$... $D_n$ as valid information.

For example if with n=5 incoming channels and q=3, two channels become defective, the signal at output 3 corresponds to the data of the remaning three non-defective channels. On the other hand, if 3 channels become defective, then these output data correspond to those which are applied to the defective channels. It has become apparent that the output signal of the selective logic system 9 must be used to weight the output signal of the selective logic system 1. This is done by means of a weighting unit 11 to which the output signals of both selective logic systems 1 and 9 are applied and which produces an output signal 3" corresponding to the output signal 3 of the selective logic unit 1 if at least q of the n channels transmit correctly according to the output signal of the selective logic system 9 and which produces a marking output signal if the selective logic system 9 has identified fewer than q of the channels as undisturbed.

A further feature suggests itself, i.e. that of devising the marking units 7 as storage units which are set in dependence on the comparison results in the comparators 5.

If the marking units 7—which hereinafter will be referred to as stores—are devised in such a way as to be resettable only externally, as has been indicated by dashed lines in FIG. 1, then the further object is achieved, that even short-term defects in channels $D_1$ to $D_n$ stay registered until external resetting is effected and the corresponding channels are thus registered as faulty.

From the security point of view the system as hitherto described poses a further problem. The monitoring network, which consists of a comparison element 5, the storage devices 7, the "q of n" selective logic system 9 and the weighting unit 11 should be devised as an error-proof system, because a fault developing in one of these functional blocks might again produce error information at the output of the weighting unit 11. Such internal faults should be detected automatically in such a way that faulty behavior of the above-mentioned units would be interpreted as a faulty transmission on the channel concerned or as a disability of the whole system. As has been indicated in FIG. 1, also by dashed lines, a test frequency signal is fed for this purpose to the above-mentioned, so far "unsecured", functional units from an oscillator 13. The functional units are arranged in the following manner:

The comparison unit 5 supplies the test frequency signal to its output 5' if: (1) the comparison unit is internally intact and (2) the comparison to be undertaken by this comparison unit produces agreement.

The storage device 7, on the other hand, supplies a test frequency output signal at its output 7' only if the test frequency signal supplied by the output 5' of the comparison unit is present without an interruption of predetermined duration, and only if the storage unit itself has no internal fault.

Similarly, the output signal at output 9' of the selective logic unit 9 comprises the test frequency signal only if test frequency signals are present on at least q of the n store outputs 7'.

The output signal 3' of the weighting unit 11 will then correspond to the test frequency modulated output signal of the selective logic unit 1 if a test frequency signal appears at the output 9' of the selective logic unit 9 and if the weighting unit 11 operates without ay internal fault.

Therefore, the signals which appear at output 3' are either test frequency modulated signals for the data which can be interpreted as corresponding to the primary data or, non-modulated signals which indicate unequivocally that faulty processing must have occurred between the input of the primary data and the output 3'. Depending on the given application, the test frequency modulated signal at output 3' may either be demodulated or, as will be explained later on, initially used unchanged. It will be noted that, as far as the test frequency signal is concerned, the units 5, 7, 9 and 11 are connected in series in terms of the signal, so that it will be sufficient to apply the said signal to the beginning of the chain.

The system of the invention is suitable, above all, for monitoring digital data which are serially transmitted on the processing channels.

In a variety of instances, for example, when supervising and controlling trains, the primary data, after processing and safety monitoring, are transmitted to a target system which may be, for example, a railway engine and in that case, data modulation must suit the given purpose.

Figure 2:
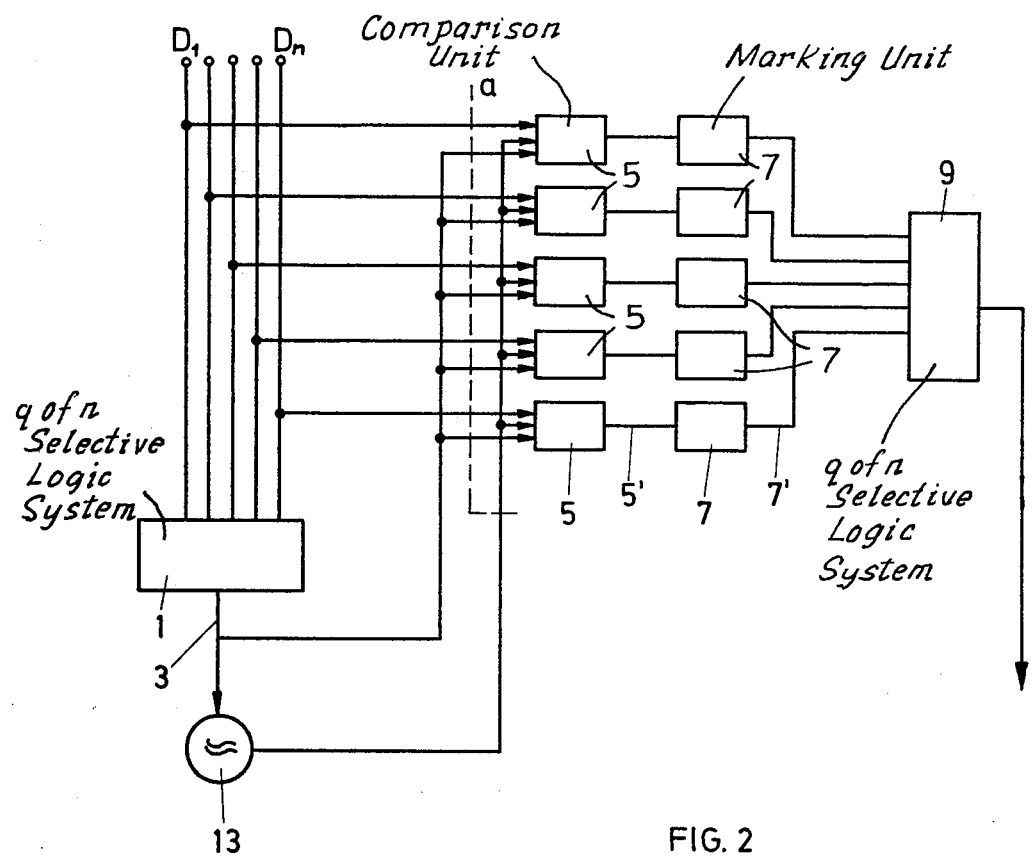
FIG. 2 a development of the diagram according to FIG. 1, ensuring the detection of internal faults, FIG. 3 a "static" q of n selective logic system for n=3, q=2, FIG. 4 a functional block diagram of a "static/dynamic" comparison unit, FIG. 5 two voltage/time diagrams which illustrate the output signal of a comparison element according to FIG. 4 in dependence on simultaneously appearing input signals, FIG. 6 an embodiment of the comparison unit according to FIG. 4, FIG. 7 a functional block diagram of a "static/dynamic" storage device, FIG. 8 a functional block diagram according to FIG. 7, with a first functional block shown in further detail, FIG. 9 the time characteristic of the low-pass cut-off voltage and its effect upon an amplitude detector according to FIG. 8, FIG. 10 a functional block diagram according to FIG. 8, with a second functional block shown in further detail, FIG. 11 a combined illustration of the diagrams according to FIGS. 8 and 10, parts of the functional blocks being illustrated by their pertinent elements, FIG. 12 an expanded functional-block diagram according to FIG. 11, being one possible solution for eliminating interference shown in connection with FIG. 11, FIG. 13 another advantageous switching arrangement in the diagram according to FIG. 12, FIG. 14 a circuit arrangement for realizing the diagram according to FIG. 12, FIG. 15 a functional-block diagram of a dynamic selective logic system, with seven signal leads, in which at least 6 or 5 of the 7 signals are used on the corresponding number of signal leads to form a fault criterion, FIG. 16 a functional unit of the selective logic system according to FIG. 15, FIG. 17 a circuit arrangement for realizing the selective logic system according to FIG. 15, with three incoming signal leads, the fault criterion being determined by identical signals on at least two leads.

In FIG. 2 a block diagram of the system is shown which is particularly suitable from this aspect and has been developed from FIG. 1. Those blocks which correspond to the blocks of FIG. 1 have been given identical reference symbols. As has been mentioned before, the output signal of the "q of n" selective logic system 1 corresponds to information which has been transmitted identically on at least q of the n channels $D_1 \ldots D_n$. This signal, which appears at output 3, is applied to the modulating input of an ocillator 13—capable of modulation—whose test frequency modulated output signal is applied via the comparison units 5, the storage elements 7 and the "q of n" selective logic system 9.

In the same way as has been described in connection with FIG. 1, the test frequency signal appears at output 9' if the conditions mentioned in connection with FIG. 1 are met, but is now, according to FIG. 2, modulated according to the primary data.

It becomes apparent that in a system such as shown in FIG. 2, the modulated test frequency signal of oscillator 13 also serves as the information carrier for the data applied to the system via channels $D_1 \ldots D_n$. As a result, a signal modulated in accordance with the primary data either appears or does not appear at the output of the "q of n" selective logic system 9, depending on whether the data applied via channels $D_1 \ldots D_n$ must be interpreted as corresponding or not corresponding to the primary data according to the preselected q of n condition. In this embodiment, the weighting unit 11 can be dispensed with, since the ocillator signal acts both as test signal and as information carrier.

The modulation of oscillator 13 is preferably angle modulation and, particularly, frequency modulation.

If data are present serially on channels $D_1$ to $D_n$ in digital form, then the oscillator 13 merely has to be modulatable on two discrete frequencies. As regards the realization of the comparison elements 5, storage elements 7 and also the "q of n" selective logic system 9, this brings about considerable simplification as regards the frequency response.

A separate step-by-step explanation of the above-described functional blocks, and their possible application, will now be given. In the system described, it is assumed that digital data are present on channels $D_1$ and $D_n$ and digital frequency modulation to frequencies $f_1$ and $f_2$ takes place at oscillator 13. However, transition to continuous frequency modulation can be realized therefrom without difficulty.

The design of the modulatable oscillator will not be discussed in further detail, since it is sufficiently well known to the expert.

Figure 3:
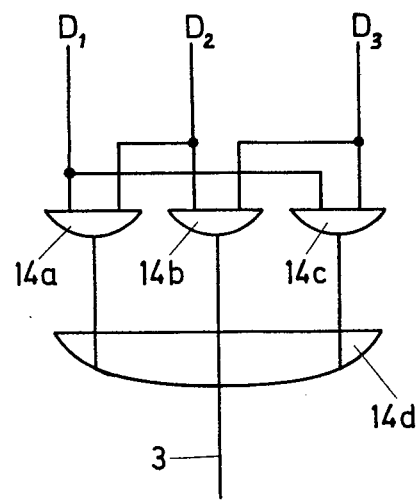

FIG. 3 shows the circuit arrangement of a "static" "q of n" selective logic system 1, for simplicity's sake for $n=3$ and $q=2$. The three channels $D_1$, $D_2$, $D_3$ are each applied to an AND element (14a, 14b, 14c respectively) whose second inputs are cyclically connected to one of the other channels in each case. All outputs of the AND elements 14a–c are applied to a triple OR element 14d. This circuit arrangement delivers at its output 3 that logic level which is present at least at 2 of the 3 inputs. It is built up from conventional logic elements.

At the interface a of FIG. 2, the modulated output signal of oscillator 13 is applied to the chain of blocks consisting of the comparison elements 5, the storage elements 7 and the "q of n" selective logic system 9. To facilitate the understanding of the logic operations taking place in the system between normal "static" logic signals and the "dynamic" signal of the oscillator 13, the following definitions are proposed:

A signal will be termed "dynamic" or "AC-signal" if, when applied to the next-following functional block, it meets alternately the latter's in/out input conditions in accordance with its own specific frequency. The term "AC-signal" will then be applied accordingly. The opposite are "static" signals or the equivalent, dc signals.

A "dynamic" logic element is a gate circuit which, basically, has signal inputs for dynamic signals and, under the aspect of the indicated logic operation, tests the presence of dynamic signals at these inputs and, at its output, delivers a dynamic signal as a "true" and a static signal as a "false" indication.

A "static/dynamic" logic element is a gate circuit which, basically, accepts inputs for static and dynamic signals and tests the presence of dynamic and static signals at the corresponding inputs, under the aspect of the indicated logic operation and, at its output, recognises a dynamic signal as "true" and a static signal as "false".

In the practice of safety technology it is customary, furthermore, to indicate those minimum conditions for a network which must be met in order that the network should supply an output signal corresponding to the "correct" or "true" definition. In that sense, a "q of n" logic network, for example, indicates a network which will deliver a "correct" output signal only if signals corresponding to the "correct" state appear at least at "q of its n" inputs.

The definition which, amongst others, will be used in the following description is based, however, on the question "what is the minimum number of conditions that must not be met for the network to deliver a "false" output signal." Thus, a "m of n" network will refer to a network which delivers a "false" output signal only when more than m of its n inputs receive "false" input signals. These definitions may be made to merge by using the equation $$m = n - q$$

Furthermore it should be noted, at this stage, that the functional blocks which will now be described are error-proof in terms of a fault catalogue such as used in "fail-safe technology". To prove this would go beyond the scope of the present discussion.

Figure 4:
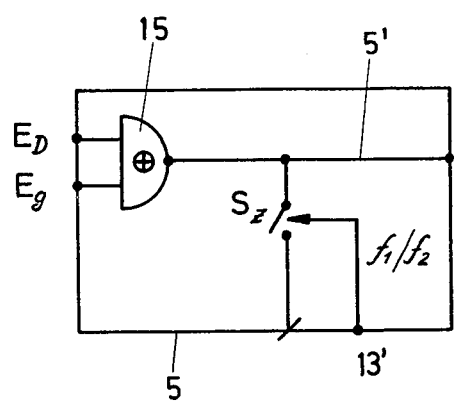
Figure 5:
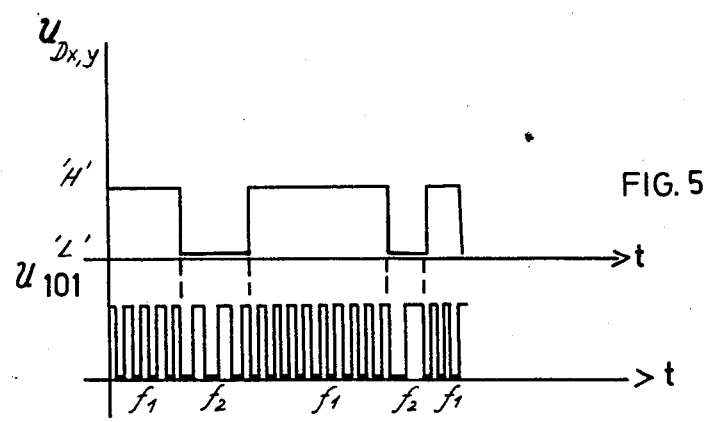

FIG. 4 is a functional circuit diagram of the comparison elements 5 in FIG. 2. As has already been mentioned, it functions in the following manner:

If the data on a channel picked at random with which a comparison unit 5 is associated correspond to the data of altogether at least q channels, then a test signal which is frequency-modulated in accordance with the data should appear at the output of the comparison unit 5. This is realised in that a corresponding channel $D_X$ is taken to a first input $E_D$ and the output 3 of the "q of n" selective logic system 1 to a second input $E_q$ of an equivalent gate or EXNOR (exclusive NOR) gate 15. At the output 5' of this equivalent gate 15 a signal having the level "1" will always appear if the signals applied to the two inputs $E_D$ and $E_q$ are identical. Apart from possible switching transients, therefore, a static signal will appear at the output 5' of the comparison unit 5 when there is equivalent information on the corresponding channel $D_X$ and at least q-1 remaining channels. Since the test frequency signal of oscillator 13 according to FIG. 2 must be applied as nearly as possible to the beginning of the chain of functional blocks comprising comparison unit 5, storage element 7 and "q of n" selective logic system 9, a signal at the output 5' is chopped by means of a chopper switch at $S_Z$ whose control input 13' is connected to the output of oscillator 13 according to FIG. 2. The information of channel $D_X$, lost in the equivalent gate 15 is now introduced in the signal chain by frequency modulation of the signal at output 101 with the aid of switch $S_Z$. In accordance with the information applied on at least q of the channels $D_1$ to $D_n$ the oscillator 13 is digitally frequency modulated, as has been stated before, so that a chopper switch $S_Z$ has two discrete frequencies $f_1$ and $f_2$ applied to it. In FIG. 5, digital data incoming on channel $D_X$ are shown as a function of time, together with the corresponding characteristic of the digitally frequency-modulated signal at output 5'.

As can be seen from the block diagram of FIG. 4, the test frequency signal of the oscillator 13 is applied to the comparison element 5 only after the equivalent gate 15. Therefore, matters have to be arranged in such a way that an internal fault in the equivalent gate 15 has the effect of preventing any frequency modulated signal from appearing at output 5' of the comparison element 5. In other words, it is necessary to ensure that also in the case of an internal fault the same potential appears at the output of the equivalent gate 15 to which the latter is switched by the chopper switch $S_Z$. This potential may be zero potential, for example, as in FIG. 4. In safety engineering, fail-safe anticoincidence gates are known. If one of the two inputs $E_D$ or $E_q$ is inverted, it is possible to use such an anticoincidence gate 15' instead of an equivalent gate. The simplest way to achieve this is to devise the q of n selective logic system 1 in such a way that it produces signals which are inverted with reference to the applied channel signals.

Figure 6:
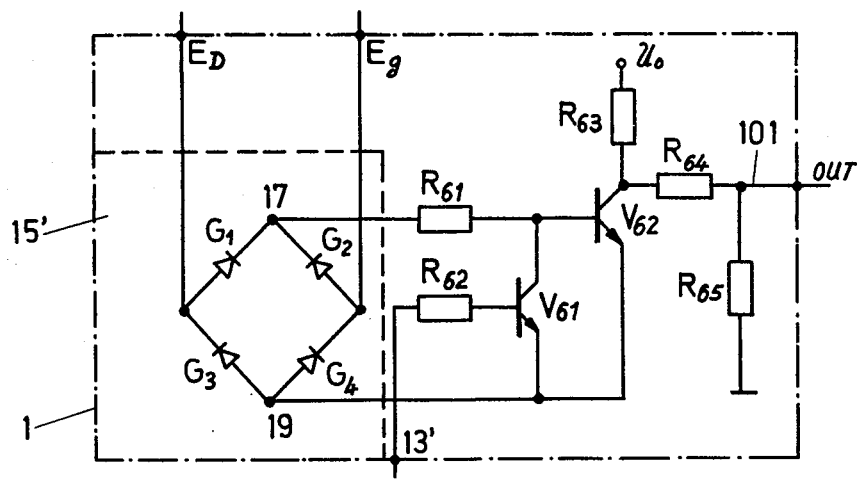

FIG. 6 shows one way of realising the functional circuit diagram of FIG. 4 by employing an anticoincidence gate. The known anticoincidence gate 15' consists of a Gratz rectifier bridge comprising diodes $G_1$ to $G_4$ to which the inverted data are applied from output 3 of the q of n selective logic system 1 at its input $E_q$ while data of the particular channel $D_X$ are applied to its input $E_D$. The chopper switch $S_Z$ is realised by means of a switching transistor $V_{61}$ which is connected across the GrUMLa tz circuit outputs, 17 and 19 respectively. As shown in FIG. 6, the Grätz circuit consisting of diodes $G_1$ to $G_4$ is preferably connected independently of a reference potential, and the collector-emitter path of the chopper transistor $V_{61}$ is taken to the base-emitter path of a further transistor $V_{62}$. The emitter of the chopper transistor $V_{61}$ is directly taken to one output terminal 19 of the GrUMLa tz circuit $G_1$ to $G_4$, whereas the collector is connected via a resistor $R_{61}$. The base of the chopper transistor $V_{61}$ is connected to the control input 13' via a further resistor $R_{62}$.

To the collector of the second transistor stage $V_{62}$ a reference potential $U_O$ is applied via a first resistor $R_{63}$, and ground potential is applied via two further resistors $R_{64}$ and $R_{65}$, the signal across the last-mentioned resistor $R_{65}$ being the output signal taken to the output 101.

If the two digital signals applied to the inputs $E_D$ and $E_q$ are complementary, a direct voltage appears at outputs 17, 19 of the GrUMLa tz circuit $G_1$-$G_4$ which appears at output 101 as a voltage chopped according to frequency.

Figure 7:
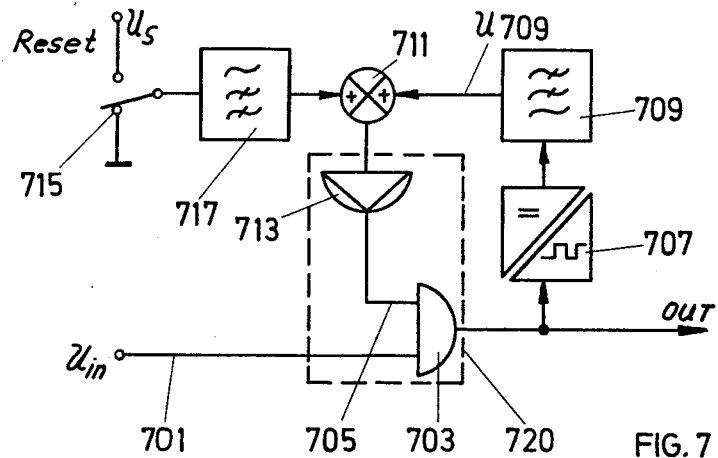

FIG. 7 shows a functional circuit diagram of a storage device 7 according to FIG. 2. As far as its input and its output are concerned, it is characterised by the following properties and is provided with two signal inputs of which one is intended for the dynamic signal to be monitored, which is available at output 5' of the comparison element (see FIG. 2).

Let us assume $U_{in}$ to be the input signal at the input destined for the signal to be monitored, and $U_{out}$ the output signal.

Then we assume that:

(1) For a dynamic $U_{in}$, $U_{out}$ is dynamic.

(2) If $U_{in}$ is static during a period $\Delta t > \Delta t_M$ ($\Delta t_M$ being a predetermined fixed period of time which starts with $U_{in}$ becoming static) then the output signal $U_{out}$ becomes static after the final instant $t_M$ of the predetermined period $\Delta t_M$, i.e. for all times $t > t_M$.

This condition of $U_{out}$ is to be suspended only by a clearing signal at the second signal input.

Besides, faults within the device such as defined in a fault catalogue known in "fail-safe" technology should have the result that $U_{out}$ becomes static and that this condition can likewise only be suspended by a clearance signal after the fault has been eliminated.

From this operating mode it appears that the storage device 7 can be referred to as a "static/dynamic" storage device, and this definition will be used from now on in the description.

Via an input 701 of the storage device, the dynamic signal which is to be monitored is taken from a comparator output 5' to a dynamic/static AND gate 703. The dynamic/static AND gate 703 (from now on, we shall abbreviate dynamic/static to "dst") has a second static input 705. In the presence of a dynamic signal (ac voltage) at input 701 and of a static signal (dc voltage) at input 705 the dst-AND gate 703 delivers a dynamic output signal, firstly to the storage output "out" and, secondly, to the input of a frequency/dc-converter 707. The output signal of the converter 707 is fed via a low pass filter 709 to an OR-element 711, the output signal of the latter being taken to a threshold detecting element 713. The output signal of the latter—a static signal—is applied to the static input 705 of the dst-AND gate 703.

Reset means for the storage device comprise a switch 715 by means of which a short signal pulse is produced which is taken to a high-pass filter 717. The output of the high-pass filter 717 is applied to the second input of the OR-element 711.

If a dynamic signal is present at input 701 at the beginning and if the reset arrangement is actuated via the switch 715, a brief pulse at the output of the high-pass filter 717 causes the input of the OR-element 711 briefly to assume the "1" state, with the effect that the threshold detecting element 713 briefly transmits a signal to the static input 705 of the dst-AND gate 703. At this moment, a dynamic signal appears at the output of this gate and generates at the frequency/dc converter 707 a direct voltage which, smoothed by means of the low-pass filter 709, is taken to the second input of the OR-element 711. As a result, a static signal will now be permanently present at the input 705 of the dst gate 703 and, consequently, the storage output "out" remains dynamic. If a dynamic signal does not appear at the input 701 of the dst-AND gate 703, the frequency/dc converter 707 will no longer generate a direct voltage, and the output signal $U_{709}$ of the low-pass filter 709 begins to decay. If a dynamic signal reappears at the input 701 before the output signal $U_{709}$ of the low-pass filter 709 has fallen below the threshold voltage of the threshold detecting unit 713, the frequency/direct voltage converter 707 will again supply a direct voltage and a dynamic signal will again appear at the output of the storage device.

However, if the output signal $U_{709}$ of the low-pass filter 709 has fallen below the threshold, a dynamic signal will no longer appear at the output of the dst gate 703, even if a dynamic input signal becomes available again, and the storage output signal remains static. Information to the effect that the dynamic signal to be monitored, i.e. the output signal of the comparison unit 5, has failed to appear and caused a fault condition will thus have been stored. This information is cancelled by means of the reset device in the shape of switch 715 in that a static signal at input 705 of the dst-AND gate 703 is briefly simulated from without, via the elements 711, 717, 713.

Further drawings are intended to illustrate, first of all, step-by-step the basic possibilities of realising the various functional units according to FIG. 7, in order, eventually, to furnish a complete circuit diagram and to emphasise that this circuit diagram represents merely one of various possible embodiments.

Figure 8:
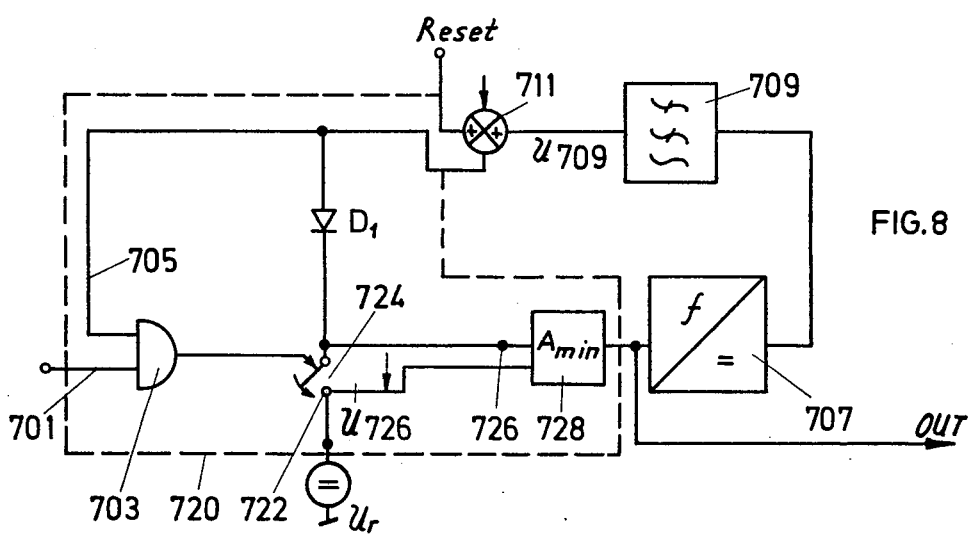

Apart from the frequency/direct voltage converter 707, the low-pass filter 709 and the OR-gate 711, FIG. 8 shows in particular a combination of the dst-AND element 703 with the threshold detecting element 713 of FIG. 7. This combination unit 720 comprises the dst-AND gate 703 with inputs 701 and 705. The output of the dst-AND gate 703 controls a switch 724 which latter switches an input 726 of an amplitude detector 728 briefly to reference voltage $U_r$. Input 726 is connected to the direct voltage input 705 of the dst gate 703. If the reference voltage $U_r$ is fixed, the amplitude $\hat{U}_{726}$ of the alternating voltage at the input 726 of the amplitude detector 728, in relation to the reference voltage is $$\hat{U}_{726} = U_{709} - U_r$$

and decays with $U_{709}$. If the amplitude detector 728 detects only signals with $$\hat{U}_{726} > A_{min}$$

then a dynamic signal will appear at the output of detector 728 only if $$U_{709} > A_{min} + U_r.$$

It becomes clear, therefore, that the unit 720, like the threshold detecting unit 713, prevents the appearance of a dynamic signal at the storage output if the direct voltage $U_{709}$, fed back via the low-pass filter 709, falls below a predetermined threshold.

Figure 9:
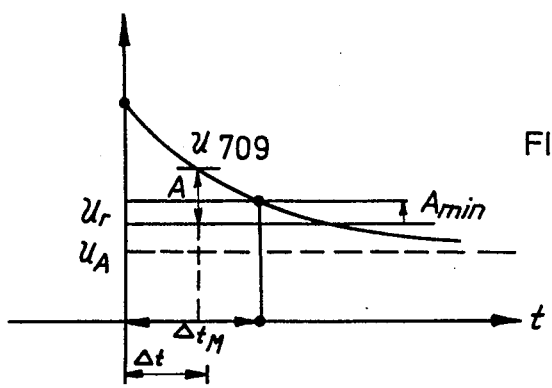

If the dynamic signal, i.e. the comparison unit output signal fails to appear at input 701, either because the compared data do not agree or because of an internal fault in the comparison unit, then the signal controlling the switch 724 becomes static. The output signal $U_{709}$ of the low pass filter 709 drops asymptotically, as FIG. 9 shows, towards a reference value $U_A$. If the dynamic signal reappears at input 701 when a predetermined time $\Delta t$ has elapsed, the switch 724 switches the input 726 of the amplitude detector 728 from the output voltage $U_{709}$ of the low pass filter to the reference voltage $U_r$, resulting in a signal amplitude according to A in FIG. 9 at the dynamic input 726. If the time $\Delta t$, i.e. the time between failure of the dynamic input signal and its reappearance, exceeds the value $\Delta t_M$, then A drops below the value $A_{min}$ and the output of the amplitude detector 728 becomes static. FIG. 9 also shows that, generally, the output signal of the low-pass filter 709 could, depending on the reference value $U_A$, fall below the reference signal $U_r$ far enough for the amplitude detector 728 to supply again a dynamic signal; this is prevented by the diode D1.

The maximum no-fault failure time $\Delta t_M$ for the dynamic signal at input 701 is thus determined by the time constant of the low-pass filter 709, the reference value $U_A$, the stationary signal $U_{709}$, the reference voltage $U_r$ and the still detectable minimum amplitude $A_{min}$ of the amplitude detector 728.

Figure 10:
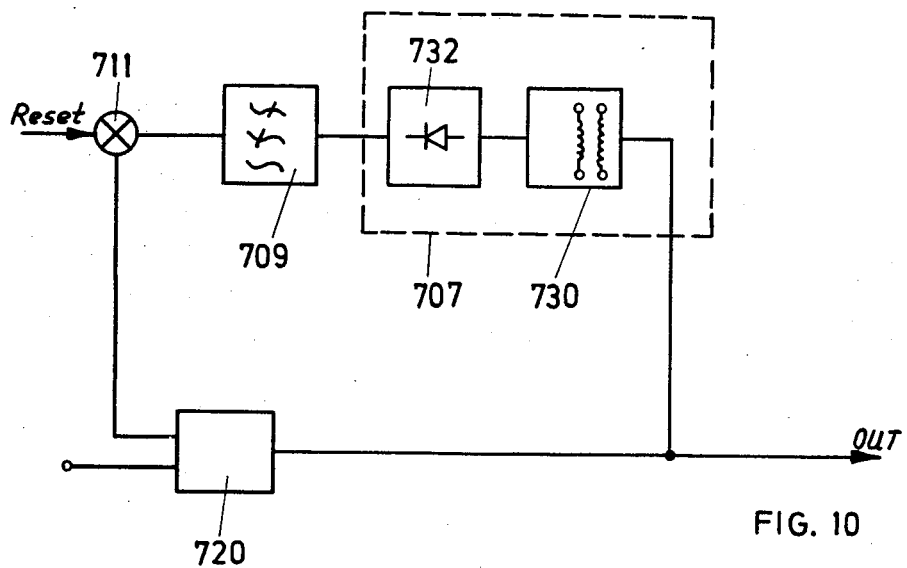

FIG. 10 shows a basic layout of the frequency/direct voltage converter 707, the drawing being completed by the low-pass filter 709, the OR gate 711 and the combined unit 720. The frequency/direct voltage converter 707 basically comprises a rectifier circuit 732 which is preferably supplemented by a transformer stage 730 for matching the feedback direct voltage.

Figure 11:
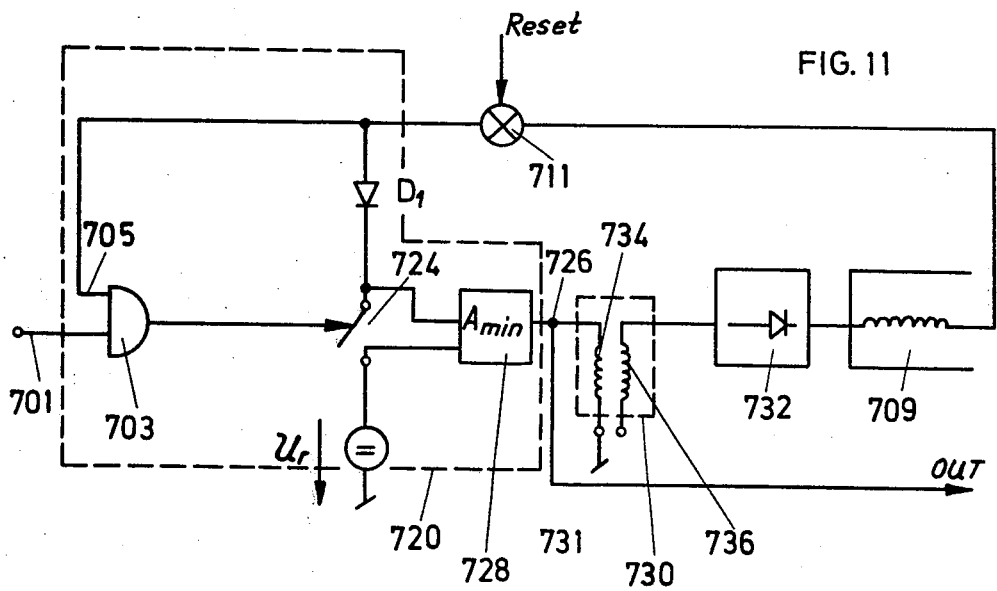

To take the explanation one step further, FIG. 11 supplements the illustration according to FIG. 8 by that of FIG. 10. The alternating voltage which appears normally at the output of amplitude detector 728 is applied to a primary winding 734 of transformer 730 which winding may be unilaterally grounded, for example. An alternating voltage which appears at a secondary winding 736 is rectified in the rectifier 732 and applied to the low-pass filter 709. This low-pass filter 709 is preferably a LR-low pass element which, in the present application, offers decisive advantages in comparison with a CR-low-pass element, as will be explained later and should definitely be used from the point of view of obtaining an error-proof arrangement.

The circuit arrangement must be such that $\Delta t_M$ is reduced or, at most, increased only slightly within a predetermined limit when a fault develops in the elements. Nor is it permissible that failure of some reference voltage should cause the storage output to remain dynamic.

If the circuit diagram of FIG. 11 is regarded from this point of view it becomes evident that a drop of the reference voltage $U_r$ causes the dynamic signal applied to the amplitude detector 728 to increase and that the failure of the abovementioned reference voltage will not produce a static storage output signal. Setting the reference voltage to zero constitutes one possibility of obviating this disadvantage.

Another possibility of nullifying the effects of reference voltage variations consists in devising the amplitude detector 728 as a regenerative element, i.e. in such a way that its output signal retains a fixed amplitude independent of variations in the amplitude of the input signal.

Figure 12:
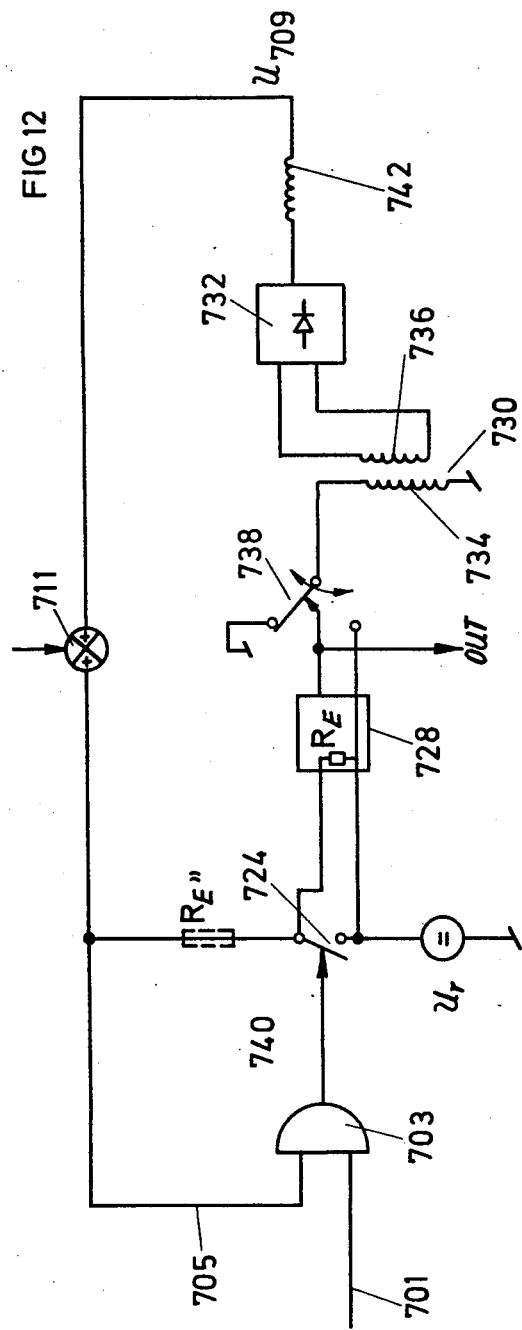
Figure 13:
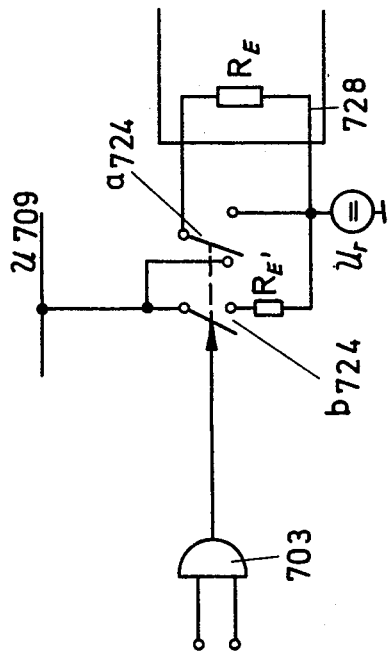

Another preferred variant is shown in FIG. 12. Here, a voltage $|U_r| > o$ is chosen which is again applied to the amplitude detector 728 as a reference voltage. Thus, the amplitude detector 728 detects potential differences between the reference potential, corresponding to $U_r$, and the output potential of the low-pass filter, corresponding to $U_{709}$ also in this case. In order to prevent failure of the reference voltage $U_r$ causing the store to produce a dynamic output signal, a changeover switch 738 is provided which, controlled by the output of the amplitude detector 728, is switched between ground potential and the reference potential according to the reference voltage $U_r$ and whose output signal is taken to the primary winding 734 of transformer 730. As a result, a drop of $U_r$ causes a reduction of $\Delta t_M$ because the alternating voltage applied to the primary winding 734 of transformer 730 will then be reduced. On the other hand, an increase of $U_r$ causes $U_{709}$ to rise. Since, with the switch 724 in one switching position (as shown) the low-pass filter is set to the reference potential according to the reference voltage $U_r$ via the inductance 742 and the input resistor $R_E$ of the amplitude detector 728, an increase in the reference voltage $U_r$ must have the effect that also the asymtotic value $U_A (=U_r)$ increases with $U_{709}$, so that an increase in $\Delta t_M$ is largely prevented. In order to ensure that the resistive load of the low-pass filter is the same in both switching positions of switch 724, the switch 724 is advantageously devised in the manner shown in FIG. 13. A first switching lever $a_{724}$ switches the input of the amplitude detector 728 between $U_{709}-U_r$ and zero. A second lever $b_{724}$ switches the output of the low-pass filter via a resistor $R_E'$ to $U_r$ if the lever $a_{724}$ shorts the detector input. If $R_E$ and $R_E'$ are equal, the load on the low-pass filter remains balanced, with the same time constant $T = L/R_E = L/R_E'$.

Another possibility is indicated by broken lines in FIG. 12, wherein a series resistor $R_E''$ with $$R_W'' \gg R_E$$

is allocated to the low-pass filter ahead of the switch 724.

In this way, the negative effects of reference voltage variations are largely prevented. Complete elimination of their influence is not possible, however, since the stored energy of the low-pass varies quadratically with $U_r$ while the asymtotic reference value $U_A (=U_r)$ undergoes only linear variation.

At this stage the question why an LR-element rather than a CR-element has been chosen as a low-pass filter will be briefly discussed. According to the fault catalogue it is assumed that faulty resistors usually increase their value and that the failure of a resistor amounts to an interruption. As is well known, the time constant of an LR-element is $$T = L/R,$$

and, by contrast, that of a CR-element $$T = R \times C.$$

From this it becomes apparent that the time constant of the LR-element is reduced whereas that of the CR-element is increased when a fault occurs in a resistor and the resistance value is increased accordingly. Since the time during which the dynamic input signal of the storage device may fail without repercussions is predetermined as a permissible maximum time which should not increase but, if possible, rather decrease, it becomes clear that therefore only a LR low-pass filter is suitable for this purpose. Another advantage of employing an inductance must been seen in the fact that it is technically impossible to increase the intrinsic time constant of the latter. On the other hand, since an increase of the inductance, for example brought about by core variations, would cause the time constants of the LR-element to increase, an air gap is provided as a means for stabilising the inductance, especially against thermal variations of the core, said air gap being at least partially filled with paramagnetic material.

Figure 14:
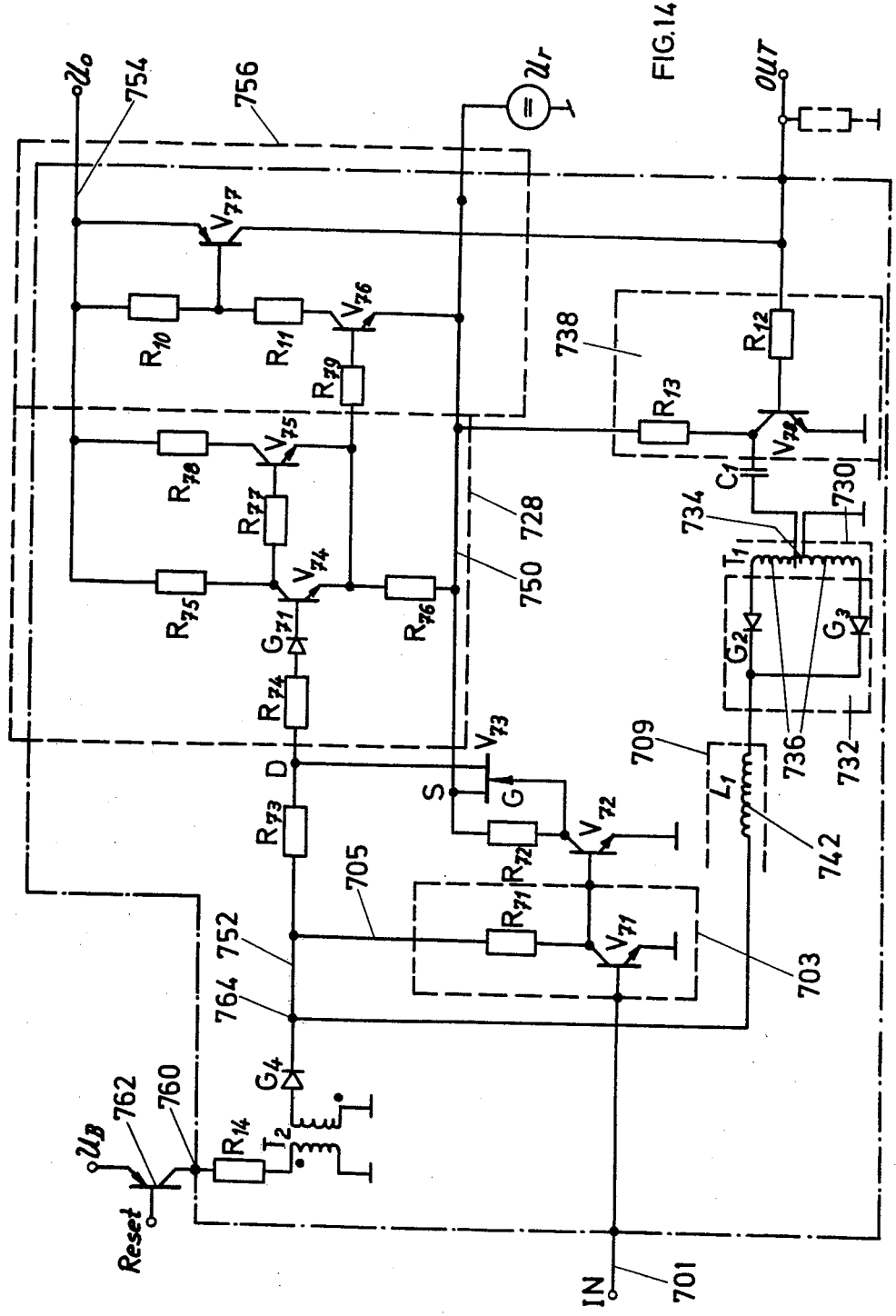

FIG. 14 shows, by analogy to the functional diagram of FIG. 12, a circuit example for the storage device.

By analogy with the block diagrams so far described, the alternating voltage signal to be monitored is applied to the dst-AND gate 703 via the dynamic input 701, and the feedback direct voltage via the direct voltage input 705. The dst-AND gate 703 comprises a transistor $V_{71}$ in grounded emitter configuration, the ac signal to be monitored being applied to its base-emitter path. Its collector is connected via a collecter resistance $R_{71}$ to the static input 705 or to a direct voltage feedback line 752. Thus, the boosted dynamic storage input signal appears at the output of the dst-AND gate 703 only provided that the dynamic input signal as well as the static input signal are present. The output signal of the dst-AND gate 703 is fed to the base/emitter path of a second transistor $V_{72}$ whose collector resistor $R_{72}$ is connected to a reference voltage source $U_r$ via a lead 750. The voltage across the collector resistance $R_{72}$ connects the gate-source path of a FET switch $V_{73}$ whose controlled path, i.e. the source-drain path is connected between the reference voltage lead 750 and, via a series resistor $R_{73}$, the direct voltage feedback line 752.

By analogy, for example with FIG. 12, it becomes apparent that the amplifier transistor $V_{72}$ and the FET switch $V_{73}$ represent the switch 724 in that the drain-source path of the FET switch $V_{73}$ is switched by the potential difference between the potential fed back to line 752 and the reference potential on line 750 on the one hand and zero on the other hand.

The signal across the drain-source path of switch $V_{73}$ constitutes the input signal for the amplitude detector 728 which is fed to a Schmitt trigger. As shown in FIG. 12, the reference potential, in accordance with the reference potential $U_r$, forms the reference potential for the Schmitt trigger. The latter consists of two emitter-coupled amplifiers $V_{74}$ and $V_{75}$ whose coupled emitters are connected via an emitter resistance $R_{76}$ to the reference voltage lead 750. The collector of the input transistor $V_{74}$ of the Schmitt trigger is connected to the base of the second transistor $V_{75}$ via a coupling resistor $R_{77}$. The collectors of the two transistors $V_{74}$ and $V_{75}$ are connected to a supply voltage lead 754 via appropriate collector resistances $R_{75}$ and $R_{78}$, the said supply voltage lead being set to a supply voltage $U_o$. The input signal of the Schmitt trigger is fed to the base of the first amplifying transistor $V_{74}$ via a resistor $R_{74}$ and a protection diode $G_{71}$. The base-emitter diode of $V_{74}$ corresponds to the diode element $D_1$ of FIG. 8.

It is usual with Schmitt triggers constructed in this way for the output voltage to be derived at the collector of the second transistor $V_{75}$, which does not, however, ensure that the output signal turns static, as required when the hysteresis-determining emitter resistor $R_{76}$ fails. However, this will be achieved when the voltage across the abovementioned emitter resistance itself is chosen as the output signal. In this sense, the coupled emitters form the output lead of the Schmitt trigger.

The Schmitt trigger, in accordance with the amplitude detector 728, acts in such a way that a dynamic signal appears at its output only when the feedback direct voltage on feedback line 752 is greater by a predetermined amount than the reference voltage $U_r$ on the reference voltage lead 750. The Schmitt trigger serves at the same time as pulse generator. The output of the Schmitt trigger is taken to the base-emitter path of a switching resistor $V_{78}$ via a driver stage 756. The driver stage comprises a first driver transistor $V_{76}$ whose base is connected to the output of the Schmitt trigger via a series resistor $R_{79}$ and whose emitter is connected to the reference voltage lead 750. Its collector is connected via a resistor $R_{11}$ and the following transistor $V_{77}$ to the supply voltage lead 754. The collector of the driver transistor $V_{77}$ is connected to the base of switching transistor $R_{78}$ via a series resistor $R_{12}$.

The switching transistor $V_{78}$ whose emitter is at ground potential and whose collector is connected to the reference voltage lead 750 via a collector resistance $R_{13}$ acts like the switch 738 of FIG. 12. Controlled by the output signal of the Schmitt trigger, it supplies an output voltage at its collector/emitter path which is switched between the reference voltage $U_r$, reduced by the voltage drop at collector resistance $R_{13}$, and earth potential. The output voltage of this switching transistor $V_{78}$ is fed to a section of the winding of a symmetrical autotransformer 730 which acts as the primary winding 734, and the output voltage of this transformer is rectified via two rectifying diodes $G_2$ and $G_3$ of the rectifier circuit 732. The rectified voltage is returned via an inductance $L_1$ corresponding to the low-pass inductance 742 of FIG. 12, and the feedback lead 752. The inductance $L_1$ acts as a low-pass filter with fixed time constant, with the collector resistor $R_{71}$ and together with the input resistors $R_{73}$ and $R_{74}$ of the Schmitt trigger if the switch $V_{73}$ is set so as to block, and together with the resistor $R_{73}$ if the switch $V_{73}$ is set to conduct.

As has already been mentioned with reference to FIG. 7, the clearance device of the store basically comprises a switch and a high-pass filter. The high-pass filter is used to differentiate a switching function generated by the switch 715, in order to ensure that the storage device remains activated only for a period such as determined by the time constant of the differentiating element, even if the switch were to be actuated for a longer period of time. In this way, a dynamic clearing device is obtained. Obviously, the differentiating element or the high pass filter 717 may be realised in one of many ways known to the electrical engineer, although any such variants are limited by the condition that also this unit should be error-proof according to the previously mentioned terms. An embodiment of the clearing device which meets these criteria is shown in FIG. 14. It comprises a transformer $T_2$ whose primary and secondary windings are coupled back to back, as has been indicated in the conventional way by the two reference points. Both windings are unilaterally grounded, the secondary winding being connected via a diode $G_4$ to the direct voltage feedback lead 752. The primary winding of the transformer $T_2$ is connected via a current limiter $R_{14}$ to the clearing input 760 of the storage device to which a negative switching step is applied for the coupling directions of the transformer shown by way of example, e.g. by blocking a switching transistor 762.

The negative current step at the primary winding of the transformer produces a positive voltage pulse at the dc feedback lead 752 which pulse, in accordance with its fall time, keeps the dst-AND gate 703 in the operative condition until the feedback direct voltage appears on lead 752. The OR-element 711 of FIG. 7 is thus represented by the summing junction 764.

Since the dynamic test signal on input 701, which serves as the data transmission signal is a digital signal modulated at two frequencies $f_1$ and $f_2$, the primary winding 734 of the transformer 730 is connected in series with a capacitance $C_1$, in order to obtain a series resonant circuit. If a resonance frequency $$f_o = f_1 + f_2/2$$

is chosen, transmission from switching transistor $V_{78}$ to rectifier 732 will take place under the same conditions for both modulation frequencies. The collector resistance $R_{13}$ of switching transistor $V_{78}$, which resistor is connected in series with the resonant circuit ensures sufficient damping for the resonant circuit to decay quickly when the corresponding transistor input goes static.

It goes without saying that a storage device suitable for achieving the given task may be realised in many ways, different from the embodiment shown in FIG. 14, always provided that the storage device operates in an error-proof manner. Consequently, all element faults listed in a fault catalogue must cause the output of the storage device, corresponding to the base/emitter path of the switching transistor $V_{78}$, to go static.

Figure 15:
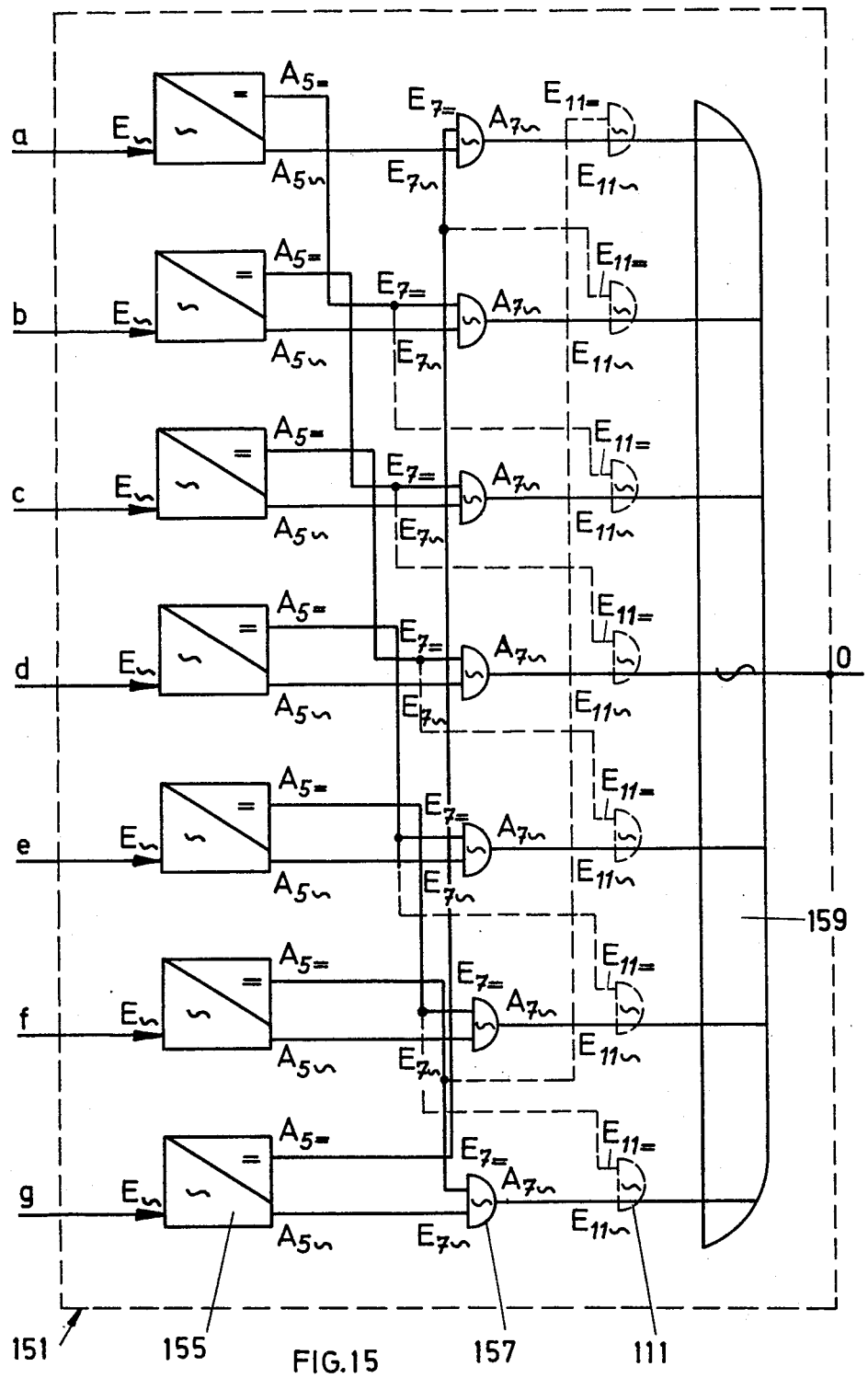

The following values were found for the elements of FIG. 14:

$R_{71}$—5.6 k$\Omega$
$R_{72}$—0.56 k$\Omega$
$R_{73}$—5.6 k$\Omega$
$R_{74}$—1 k$\Omega$
$R_{75}$—3.9 k$\Omega$
$R_{76}$—0.056 k$\Omega$
$R_{77}$—3.9 k$\Omega$
$R_{78}$—0.39 k$\Omega$
$R_{79}$—1 k$\Omega$
$R_{10}$—2.2 k$\Omega$
$R_{11}$—5.6 k$\Omega$
$R_{12}$—2.2 k$\Omega$
$R_{13}$—0.033 k$\Omega$ FIG. 15, which shows a functional block diagram of the "q of n" or "m of n" selective logic system, depending upon whether one asks for information on the conditions of one or the other output signal, will first be explained in terms of its general circuit concept, irrespective of the number of channels $D_1 \ldots D_n$ provided (FIG. 2).

Seven lines a ... g to be monitored are applied to the selective logic system 151 as inputs. The output signal becomes available at an output O.

As far as its inputs and outputs are concerned, the selective logic system 151 is a "dynamic" logic system. If all the seven—generally n—input signals on the (generally n) input leads a ... g are dynamic, in accordance with the output signals of the preceding n storage devices 7 previously described (FIG. 2), then the output signal at output O is likewise dynamic. This output signal will go static if, for example, the signals at more than five of the seven inputs are static—in general terms, at more than m of the n inputs. The number of m can be chosen by making provisions in the circuit, as will be explained later on.

Figure 16:
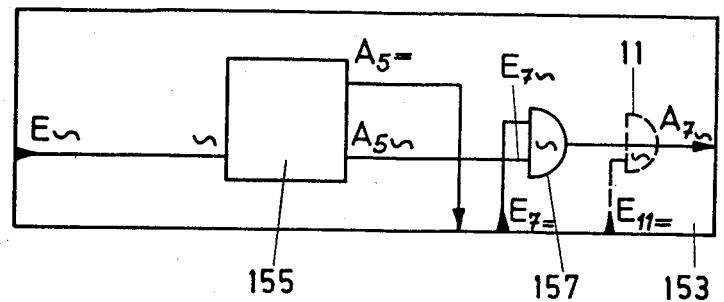

According to the number of lines a ... g applied to it, the selective logic system 151 comprises a number of identically constructed function units 153 (FIG. 16), for example, seven. Each of these functional units 153 comprises a dynamic/static converter 155 to each of which one of the input leads a ... g is applied at an ac input $E\sim$. The converters 155, in each case, convert the dynamic signal applied at the input $E\sim$ into a static output signal at the static output $A_{5=}$ and, moreover, set a dynamic signal of the same frequency as that of the signal at input $E\sim$ to a dynamic output $A_5\sim$. The dynamic output signals at outputs $A_5\sim$ are each applied to a static/dynamic AND-element 157 which comprises a static input $E_{7=}$ in addition to a dynamic input $E_7\sim$.

The output $A_7\sim$ of the AND-element 157 forms the ac output of any particular functional unit 153. Its dc output is the output $A_{5=}$ of the converter 155, and its dc input the input $E_{7=}$ of the AND-element 157. The ac input, finally, is represented by the input $E\sim$ of converter 155.

In order to choose m, appropriate connections of the static outputs $A_{5=}$ to the static inputs $E_{7=}$ between various functional units 153 are effected.

FIG. 15, first of all, shows the circuit for m=5—in general terms, m=n−2. Every static output $A_{5=}$ of the functional units 153 is connected, alternating cyclically, to the static input $E_{7=}$ of a further functional unit 153.

The dynamic outputs $A_7\sim$ of the functional units 153 are all applied to a common dynamic OR-gate 159. The OR-gate 159 delivers a dynamic signal at output O of the selective logic system 151 if a dynamic signal is present on at least one input lead $A_7\sim$.

If a signal at one of the inputs $E\sim$ of the converters 155 turns static, for example on lead a, then, first of all, a dynamic output signal will not appear at the dynamic output $A_7\sim$ of this particular functional unit 153. Secondly, owing to the fact that an output signal likewise does not appear at the static output $A_{5=}$ of this particular functional unit 153, a dynamic input signal at $E\sim$, while being present in a second functional unit 153, e.g. on lead b, cannot pass to output $A_7\sim$ and thus to the OR circuit 159.

From this it is apparent that, owing to the failure of the dynamic signal on one of the input leads a ... g the dynamic output signal $A_7\sim$ of two functional units 153 to inputs of the OR-gate 159 goes static. If static signals are present on six of the seven inputs a ... g, all seven inputs of the OR-gate 159 are static, so that the output signal at output O of the selective logic unit 151 turns static too.

It has been indicated by dotted lines in FIG. 15 how the static outputs $A_{5=}$ are to be connected with the static inputs of the functional units 153, in order that the selective logic system 151 will deliver a static signal if the signals $E\sim$ are simultaneously static at more than four of the input leads a ... g. To this purpose, each static output $A_{5=}$ of a first functional unit 153 picked by way of example is taken cyclically for all functional units 153 to a static input $E_{11=}$ of a further static/dynamic AND-element 111 whose dynamic input is connected to the output of one of the AND-elements 157 whose static input signal is not supplied by the above-mentioned selective functional unit 153. Thus, failure of the dynamic signal on one of the leads a ... g, for example on lead a, causes, again via a gate 157, the elimination of the dynamic output signal on $A_7\sim$ at the functional unit 153, corresponding to lead b and, furthermore, via the corresponding static/dynamic AND-gate 111, the failure of the dynamic output signal of the lead $A_7\sim$ of the functional unit 153 corresponding to the lead c.

Owing to the cyclic switching operation, failure of a dynamic signal at one of the inputs $E\sim$ of the selective logic system 151 causes the total failure of three dynamic signals $A_7\sim$ at the input of the OR-gate 159. The output of the OR-gate 159, and thus of the selective logic 151 is therefore static if more than four, i.e. at least five of its seven inputs are simultaneously static.

From this it appears that with the cyclic AND operation of a static output $A_{5=}$ with n−(m+1) dynamic outputs $A_5\sim$ of the corresponding number of functional units 153, the selective logic system 151 will deliver a static output signal at output O if more than m of n signals are simultaneously static at the input leads. This would correspond to an indication at more than m of the n storage devices to the effect that deviations have been detected on the channels associated with them.

Figure 17:
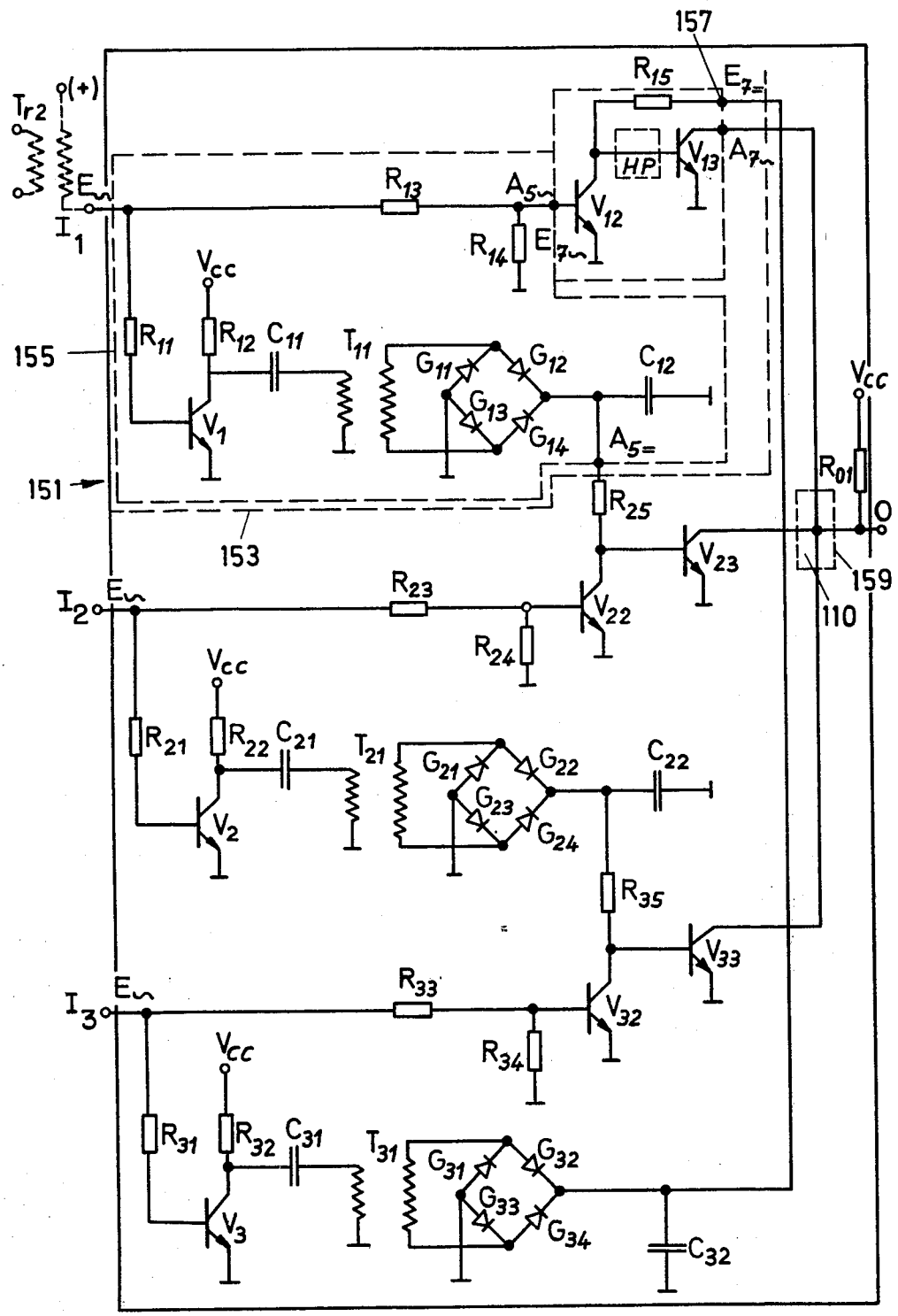

FIG. 17 shows a selective logic system which delivers a static output signal if more than one of the three input signals are simultaneously static. The functional blocks corresponding to those of FIGS. 15 and 16 have been indicated by dotted lines.

This circuit arrangement comprises three identically constructed functional units 153 and they will be referred to in general terms by a generalization of the symbols in the course of further description. The selective logic system 151 comprises three inputs, i.e. $I_1$, $I_2$, $I_3$ each of which is taken to a functional unit 153, which corresponds to inputs a . . . g of FIG. 15. The circuit elements of the three functional units are provided with position symbols $X_{rs}$, the indices r referring to the corresponding input $I_r$.

The signal present at an input $I_r$ is taken directly to the output $A_{5\sim}$ of the converter unit 155 via a potential divider $R_{r3}$ and $R_{r4}$. Via a base resistor $R_{r1}$, the signal fed on lead $I_r$ is furthermore applied to the base of a transistor $V_r$ whose emitter is at ground potential and whose collector is connected via a collector resistance $R_{r2}$ to a dc potential $V_{cc}$.

The load of transistor $V_r$ is a series-resonant circuit which is formed by a capacitor $C_{r1}$ and an impedance, on the primary side, of a transformer $T_{r1}$. The secondary winding of the transformer $T_{r1}$ is connected to the Ac terminals of a Grätz-circuit, with diodes $G_{r1}$ to $G_{r4}$. One of the direct voltage terminals of the Grätz-circuit is at ground potential. A smoothing capacitor $C_{r2}$ is connected in parallel with the direct voltage terminals of the Grätz-circuit. The direct voltage output of the Grätz-circuit forms the static output $A_{5=}$.

When a dynamic signal is applied to input $I_r$, a dynamic signal likewise appears at output $A_{5\sim}$, its amplitude corresponding to the dividing ratio of the potential divider formed by $R_{r3}$ and $R_{r4}$.

A signal range is defined by the cut-off and the saturation voltages $U_c$ and $U_s$ of transistor $V_r$. If both extreme points of the applied dynamic signal at the input $I_r$ are situated above or below this range, the transistor $V_r$ will either be blocked, or conduct, permanently. If the extreme points are situated in pairs above as well as below this range, then the transistor $V_r$ is rendered conductive and blocked at the rhythm of the dynamic signal.

From the way transistors operate it becomes apparent that the abovementioned conditions are sufficient in the sense that the transistor turns permanently more or less conductive or blocked-or turns more or less conductive and blocked at the rhythm of the dynamic signal also under different circumstances. For if the extreme points are situated within the range, the transistor is fully modulated in the active region. Whether, in that case, a given signal amplitude is sufficient to generate a sufficiently static signal for the other functional units 153 will depend largely on the transmission characteristics of transformer and rectifier and on the threshold of the static input $E_{7=}$ connected thereto.

In accordance with the ratio of the circuit frequency of transistor $V_r$ and the resonant frequency of the series-resonant circuit formed by $C_{r1}$ and the transformer primary impedance, an alternating voltage is fed to the ac terminals of the GrUMLa tz-circuit. This voltage is subjected to full-wave rectification, so that a direct voltage appears at the static output $A_{5=}$.

Since the dynamic signals applied to the inputs $I_r$ have two specified frequencies, in accordance with the digital frequency modulation of the oscillator 13 of FIG. 2, the series-resonant circuit consisting of $C_{r1}$ and the primary impedance is devised in such a way that its resonant frequency is situated as symmetrically as possible between these specified frequencies, so that identical transmission characteristics are ensured for either frequency as far as transformer $T_{r1}$ and the subsequent Grätz-circuit are concerned.

According to FIG. 15, the dynamic converter output $A_{5\sim}$ is applied to the static/dynamic AND-element 157.

In the embodiment of FIG. 17, this AND-element 157 comprises a transistor $V_{r2}$ whose base electrode is the dynamic input $E_{7\sim}$. The emitter of transistor $V_{r2}$ is grounded. The collector is taken to the static input $E_{7=}$ via a collector resistance $R_{r5}$. The collector of transistor $V_{r2}$ is also directly connected to the base of a further transistor $V_{r3}$ whose emitter is again grounded and whose collector forms the dynamic output $A_{7\sim}$.

From this circuit arrangement it becomes clear immediately that a dynamic signal appears at the dynamic output $A_{7\sim}$ only if, firstly, a dynamic signal applied to the detector input $I_r$ causes the transistor $V_{r2}$ to be switched (here, the previously explained conditions for $V_r$ also apply, taking into account the potential divider $R_{r3}$, $R_{r4}$) and if, secondly, a direct voltage is applied to the collector/emitter path of transistor $V_{r2}$ via the direct-voltage input $E_{7=}$. Therefore, if either the dynamic signal at output $A_{5\sim}$, and thus at the input $E_{7\sim}$, or if the static signal at input $E_{7=}$ fail to appear, a dynamic signal will not appear at the dynamic output $A_{7\sim}$.

In accordance with FIG. 15, the static output $A_{5=}$ of a functional unit 153 allocated to the input lead $I_r$ is connected to the static input $E_{7=}$ of a further functional unit 153 in cyclically alternating manner, and this applies to all functional units 153. If the dynamic signal fails to appear at any of the leads $I_r$, the dynamic signal at the corresponding dynamic output $A_{7\sim}$ will also fail to appear and, since there is no direct voltage at the static output $A_{5=}$ in the functional unit 153 concerned the dynamic input signal which may well be present in a second functional unit 153 is thus prevented from appearing at the associated dynamic output $A_{7\sim}$. Further static/dynamic AND-gates which may have to be provided (according to the gates 111 of FIG. 15) may be designed in the same way as the gates 157 of FIG. 17.

The dynamic outputs $A_{7\sim}$ of the three AND-elements 157 shown in FIG. 17 are taken to a summing junction 110 which is connected to the direct voltage potential $V_{cc}$ via a resistor $R_{01}$. Thus, the resistor $R_{01}$ acts as collector resistance for all the collectors of the AND output stages $V_{r3}$. Between the summing junction 110 and ground potential it will always be possible to derive a dynamic signal which varies approximately between zero and $V_{cc}$ if one of the three AND output stages $V_{r3}$ is switched and the other output stages are blocked. Linking the static outputs $A_{5=}$ with the static inputs $E_{7=}$ ensures that a dynamic signal can no longer be derived at the summing junction 110 if two of the three input signals on the leads $I_r$ are both static.

The attenuation of the series-resonant circuit formed by $C_{r1}$ and the primary impedance of transformer $T_{r1}$, and the time constant depending upon the smoothing capacitor $C_{r2}$ and the collector resistance $R_{r5}$ of the functional unit 153 supplied determine the maximum period during which a dynamic signal applied to the inputs $I_r$ may fail to appear before such failure is detected by a drop of the direct voltage at the static output $A_{5=}$ which varies the function.

It appears from FIG. 17 that it is necessary to ensure that in the case of one of the input signals $I_r$ turning static the corresponding output stage of the AND element 157 continues to block. This can be achieved, without difficulty, by means of circuit elements preceding the selective logic system 151. In FIG. 17, such circuitry is shown for the input $I_1$ by dotted lines, for example. If the signal to be monitored is coupled to the input lead by means of a transformer, e.g. transformer $T_{r2}$ whose secondary winding is connected in series with the input $I_r$ and is connected to a positive potential unilaterally, these measures will ensure that a positive DC-voltage is applied to the input $I_r$, should the dynamic signal fail to appear.

The same object is also achieved by decoupling the input of transistor $V_{r3}$ from the output of transistor $V_{r2}$ with regard to direct current. This may be done by using a high-pass filter HP, as has been indicated by dotted lines in FIG. 17.

It would be more advantageous, however, to provide, instead of a high-pass filter, a band-pass filter for the purpose of DC-decoupling because two discrete frequencies are being used.

These precautions ensure that the output stages $V_{r3}$ of the AND elements 157 can only go static if they act as blocking stages.

From the layout of the circuit shown in FIG. 17, it also appears that a phase reversal of one of the input signals $I_r$ is sufficient cause, with regard to the other input signals, for the output O of the selective logic system 151 to go static. Any phase shift of the input signals $I_r$ in relation to one another causes a time ratio of positive and negative half-waves of the signal at the output O of the selective logic system 151 to vary. This means that also this type of fault concerning input signals can be detected, given the proper means of evaluation.

It should also be noted that precautions can be taken, eg. by various negative feed-back arrangements for transistors $V_r$ and $V_{r2}$ of the various units 153, in order to create qualitatively different "true"/"false" conditions for the various input signals $I_r$.

In regard to the embodiment illustrated in FIG. 17, the following preferred values were found for the circuit elements:

$R_{r1} = 3.9$ k$\Omega$ $R_{r2} = 0.18$ k$\Omega$ $R_{r3} = 1.5$ k$\Omega$ $R_{r4} = 0.82$ k$\Omega$ $R_{r5} = 5.6$ k$\Omega$ $R_{01} = 0.22$ k$\Omega$ $C_{r1} = 10$ nF $C_{r2} = 150$ nF The system described here ensures that a signal corresponding to the primary data appears at the output if this signal is sure to correspond to these abovementioned data. Otherwise the output signal indicates the insufficiency of processing in such a way that further electronic processing of the data is blocked at once.

At the same time, the test frequency signal, conventionally employed in fault safety practice serves also as data transmission signal which leads to a considerable simplification of the circuitry.

We claim:

1. A system for monitoring the validity of electrical data appearing on n functionally parallel-connected data channels according to a fixed criterion, wherein no conclusions are drawn as to the validity of such data if the data on more than m of said n channels are different, at least during a predetermined period of time, from the data on the remaining ones of said n channels, said system comprising, n being an integer greater than one and m being a positive integer less than n:

a first q of n selective logic system, wherein q=n−m, said first selective logic system being adapted to generate a data signal at its output which corresponds to identical data present on at least q of said n channels;

n channel-related comparison elements, each of said comparison elements being for comparing the data appearing on a respective one of said n channels with said data signal generated by said first selective logic system;

n marking units, each of said marking units being associated with a respective one of said comparison elements and being adapted to register the result of the comparison made by its respective comparison element;

a second q of n selective logic system which generates a first signal when the information registered in said marking units indicates that the data on at least q of said n channels are the same as the data signal generated by said first selective logic system and which otherwise generates a second signal; and means for generating a modulated channel data signal, said modulated channel data signal being applied to said comparison elements;

said marking units, said comparison elements and said second selective logic system cooperating in such a manner that said second selective logic system generates an alternating current signal corresponding to said modulated signal when a q out of n condition exists and a direct-current signal when a q out of n condition does not exist, said modulated signal being applied to said comparison unit as both a data carrier signal and a test frequency signal, each of said marking units being inhibited from outputting a signal representative of said result of said comparison, whenever the associated one of said comparison units fails for at least a predetermined period of time to output a signal having said test frequency, such that whenever an internal fault occurs in any of said marking units or in said second selective logic system, an output signal is produced responsive to the occurrence of said fault by the respective marking unit or second selective logic system which is the same as that produced by said faulty element upon the registration of deviating channel data; said alternating current signal being a signal whose maximum and minimum values are alternately situated above and below a predetermined signal range, said direct current signal being a signal whose maximum and minimum values are situated symmetrically outside of said signal range if they are situated outside of said range.

2. A system according to claim 1, wherein the data on said n channels is digital data and wherein said oscillator is capable of digital angle modulation.

3. A system according to claim 2 wherein said oscillator is capable of frequency modulation.

4. A system according to claim 1 wherein said oscillator is time-modulatable.

5. A system according to claim 1 wherein said comparison elements each comprise an exclusive NOR gate whose inputs receive the two respective data signals being compared and whose output is applied to a parallel chopper having a control input which is connected to the output of said oscillator.

6. A system according to claim 1 wherein said comparison elements each comprise an equivalence circuit whose inputs receive the two respective data signals being compared and whose output is applied to a parallel chopper having a control input which is connected to the output of said oscillator.

7. A system according to claim 6, wherein said equivalence circuit comprises an anticoincidence circuit and an inversion means coupled between each of its two inputs and a respective one of the two signals to be compared by the respective comparison element.

8. A system according to claim 7 wherein said anticoincidence circuit comprises a Gratz-circuit.

9. A system according to claim 6, wherein said parallel chopper switches the output of said equivalence circuit to a potential corresponding to a "false" logic level of said equivalence circuit.

10. A system according to claim 1 wherein said oscillator output signal is applied to each of said comparison elements, each of said comparison units comprising a switching means for producing at its output an alternating current (a.c.) signal corresponding to said oscillator output signal when a positive comparison is made by the respective comparison element, said switching means also to generate a direct current (d.c.) signal, when either an internal fault occurs in said comparison element or a negative comparison is made by said comparison element.

11. A system according to claim 10, wherein said marking units are devices for detecting the deviation of an electronic alternating current signal from a predetermined characteristic, each of said marking units comprising:
a logic unit which receives an output of a respective said comparison element, said logic unit being adapted to produce an indicating signal at least when the output signal of its associated comparison unit consists of a direct current signal during a predetermined minimum period; and
a clearing device for resetting said logic unit after the generating of said indicating signal.

12. A system according to claim 1, wherein each of said logic units comprise:
an a.c./d.c. AND-gate having an a.c. input and a d.c. input and an output, said AND gate being devised in such a way that it generates an a.c. signal at its output when its a.c. and d.c. inputs receive appropriate a.c. and d.c. signals, respectively; and
an a.c./d.c. converter whose input receives the output of its respective said AND gate and whose output is connected to said d.c. input of its respective said AND-gate.

13. A system according to claim 2, further including an OR-gate, said OR-gate receiving a first input from said a.c./d.c. converter and a second input from clearing device, the output of said OR-gate being applied to said d.c. input of said AND-gate until the signal fed back from said a.c./d.c. converter has been produced when an a.c. signal appears at said a.c. input of the AND-gate.

14. A system according to claim 2, wherein said logic unit comprises a threshold detection unit which is connected to said d.c. input of said AND-gate, said threshold detection unit adapted to prevent an a.c. signal appearing at the input of said a.c./d.c. converter when said d.c. input signal to said a.c./d.c. converter falls below a predetermined value.

15. A system according to claim 12, wherein a low-pass filter is connected to the output of said a.c./d.c. converter, its output being connected to said AND-gate, and the low-pass filter operating with at least a predetermined time constant for smoothing the output signal of said converter and for determining the rise/fall time of the output signal of said low-pass filter, up to the time a minimum predetermined value for the d.c. input signal of the AND-gate is attained.

16. A system according to claim 13, wherein the pulse unit comprises a high-pass filter for differentiating an externally applied switch output signal and feeding it to the OR gate.

17. A system according to claim 14, wherein the threshold detection unit comprises a controlled switching element and an amplitude detector, the control input of the switching element being connected to the output of the AND gate and the input of the amplitude detector being alternately connected between a first and a second terminal of the switching path by means of the switching element and wherein the first terminal is at a potential linearly dependent upon said signal at the d.c. input of the AND-gate whereas the second terminal has a reference d.c. potential applied to it, the amplitude detector output being connected to the a.c./d.c. converter and supplying an a.c. signal only if the input signal of the detector does not fall below a predetermined minimum amplitude level.

18. A system according to claim 14, wherein a reference input of the amplitude detector is connected to the second terminal, the signal output of the detector to the first terminal, and wherein the switching element either shorts or separates the two terminals.

19. A system according to claim 17, wherein the amplitude detector is devised in the form of a regenerative circuit by generating an a.c. output signal of fixed shape and amplitude provided that the a.c. input signal attains a minimum amplitude, while otherwise producing a d.c. output signal.

20. A system according to claim 12, wherein the a.c./d.c. converter comprises a transformer and a rectifying unit.

21. A system according to claims 17 or 20, wherein the second terminal is at ground potential in order to prevent the a.c./d.c. converter from delivering a varying d.c. signal caused by potential variations at the second terminal.

22. A system according to claim 18, wherein the first terminal is connected to the d.c. input of the AND-gate via resistors and wherein the level of the input resistance of the amplitude detector is lower than that of the resistors so that the load upon the d.c. input of the AND-gate is distributed as evenly as possible when the switch changes over.

23. A system according to claim 17, wherein the switching element comprises two switching paths and wherein a signal input of the amplitude detector is connected to the first switching path, the reference input to the second terminal and wherein the first path alternately connects the first and the second terminal while the second path connects the first terminal via a resistor to the second terminal if the first path connects the signal input to the second terminal, the value of the resistor being at least nearly equal to that of the detector input resistor.

24. A system according to claims 17 or 20, wherein a second controlled switching element is connected between the amplitude detector output and the a.c./d.c. converter input and wherein the control input of the second switch is connected to the output of the amplitude detector, a switching path of the switch changing the a.c./d.c. converter input between ground potential and the second terminal of the first switch.

25. A system according to claim 15, wherein the low-pass filter comprises an LR-series circuit.

26. A system according to claim 25, wherein the air gap of the inductance of the low-pass filter is filled at least partially with a paramagnetic material for reducing the upper limit of the inductance.

27. A system according to claim 20, wherein the secondary winding of said transformer either has a floating potential or is unilaterally grounded.

28. A system according to claim 12, wherein said d.c./a.c. AND-gate comprises an amplifier, said amplifier further comprising at least one transistor in grounded-emitter configuraton, its collector-emitter path serving as d.c. input and its base-emitter path as a.c. input.

29. A system according to claim 18, wherein the switching element comprises a FET switch.

30. A system according to claim 14, wherein the output of the AND-gate acts upon a transistor in grounded emitter configuraton whose collector, via a resistor, is connected to a reference potential lead for connection to an external direct voltage supply, and wherein the threshold detection unit comprises a bistable element and an input switch, the signal input of the bistable element being connected to the output of the a.c./d.c. converter, the reference input to the reference potential lead, and the input switch being connected with its control path across the collector resistance, and with its controlled path between signal and reference input.

31. A system according to claim 14, wherein the threshold detection unit comprises a Schmitt trigger.

32. A system according to claim 31, wherein the Schmitt trigger comprises two emitter-coupled transistors with a resistor which connects the coupled emitters to a reference potential lead, the output of the Schmitt trigger being derived across the resistor.

33. A system according to claim 23, wherein the second switching path is formed by a transistor in grounded emitter configuration, switchable between ground potential and a lead at reference d.c. potential.

34. A system according to claim 20, wherein the transformer is a symmetrical autotransformer.

35. A system according to claim 20, wherein at least one of the primary and secondary windings of the transformer forms part of at least one resonant circuit, in order to provide identical transmission by the transformer to the rectifying circuit for at least two frequencies.

36. A system according to claim 16, wherein the pulse unit comprises an oppositely coupled transformer with unilaterally connected windings.

37. A system according to claim 12, wherein the indicating signal is a direct current signal and wherein the marking units produce an alternating signal corresponding to the output signal of the oscillator if they do not produce an indicating signal.

38. A system according to claim 37, wherein the second selective logic system comprises switching means designed so as to produce a d.c. signal at least when d.c. signals are present at one and the same time on more than m of the n applied lines and wherein an a.c. output signal corresponding to the oscillator output signal appears at least when the maxima are situated above, and the minima below the range.

39. A system according to claim 8, wherein to each applied lead switching means are allocated each of which comprises one input for a.c. signals, which will be referred to as the a.c. input to which the lead is connected, at least one input for the d.c. signals, which will be referred to as the d.c. input; one output for the a.c. signals which will be referred to as the a.c. output, and one output for the d.c. signals which will be referred to as the d.c. output; and wherein the switching means, allocated to the leads are devised in such a way that neither an a.c. signal appears at the a.c. output nor a signal of predetermined level at the d.c. output if the signal applied at the a.c. input is a d.c. signal and wherein, moreover, an a.c. signal can only appear at the a.c. output if, while an a.c. signal is present at the a.c. input, d.c. signals of predetermined level are present at the d.c. inputs provided therefor.

40. A system according to claim 8, wherein the a.c. outputs of all the switching means connected to the leads are fed to OR logic elements and wherein an a.c. signal appears at the output for as long as an a.c. signal is present on at least one of the a.c. outputs.

41. A system according to claim 8, characterized in that the switching means connected to the leads each comprise an a.c./d.c. converter.

42. A system according to claim 8, wherein the switching means allocated to the leads each comprise logic elements having a first input at least indirectly connected to the a.c. input and at least one d.c. input, and furthermore an a.c. output and wherein, when an a.c. signal appears at the a.c. input, and a.c. signal will appear at the a.c. output of the logic element only if d.c. signals of predetermined level are applied to their d.c. inputs provided therefor.

43. A system according to claim 41, wherein the converter comprises at least one transformer and rectifier means.

44. A system according to claim 43, wherein at least parts of at least one of the primary and secondary windings of the transformer form part of a band pass, so as to provide identical transmission by the transformer to the rectifier means for at least two frequencies.

45. A system according to claim 44, wherein the band-pass comprises at least one series resonant circuit.

46. A system according to claim 41, wherein the converter comprises means for processing an applied a.c. signal.

47. A system according to claim 40, wherein in each case there are provided between the switched leads and the inputs of the OR elements high and/or band pass filters, for decoupling these inputs from the connected leads with regard to direct current, and for providing identical transmission characteristics for at least two frequencies.

48. A system according to claim 42, wherein the logic elements comprise at least one switching element whose control input is operatively connected to the a.c. input and whose control path is situated between one of the d.c. inputs provided and a connection to the reference potential.

49. A system according to claim 38 or 40, wherein the logic elements comprise at least one switching element whose control input is operatively connected to the a.c. input and wherein the controlled paths of the switching elements of all the switching means connected to the leads are connected in parallel and unilaterally taken to a reference potential to form the OR element.

50. A system according to claim 39, wherein the d.c. output of all switching means allocated one each to a lead is connected to a d.c. input of switching means which are allocated to at least one further lead.

51. A system according to claim 38, wherein the switching means operate in such a way that at least one of phase and frequency variations of at least one applied signal vary the output signal as regards the other applied signals.

* * * * *